(12) United States Patent
Hin et al.

(10) Patent No.: US 12,550,788 B2
(45) Date of Patent: Feb. 10, 2026

(54) LOW Z-HEIGHT LED ARRAY PACKAGE HAVING TSV SUPPORT STRUCTURE

(71) Applicant: Lumileds Singapore Pte. Ltd., Singapore (SG)

(72) Inventors: Tze Yang Hin, Cupertino, CA (US); Erik Young, San Jose, CA (US); Kentaro Shimizu, Sunnyvale, CA (US); Grigoriy Basin, San Francisco, CA (US); Emma Dohner, Menlo Park, CA (US); Brendan Jude Moran, San Jose, CA (US)

(73) Assignee: Lumileds Singapore Pte. Ltd., Singapore (SG)

( * ) Notice: Subject to any disclaimer, the term of this patent is extended or adjusted under 35 U.S.C. 154(b) by 412 days.

(21) Appl. No.: 18/097,932

(22) Filed: Jan. 17, 2023

(65) Prior Publication Data

US 2023/0170456 A1 Jun. 1, 2023

Related U.S. Application Data

(63) Continuation of application No. PCT/US2021/041867, filed on Jul. 15, 2021.
(Continued)

(30) Foreign Application Priority Data

Sep. 9, 2020 (EP) .................................... 20195344

(51) Int. Cl.
*H01L 25/18* (2023.01)
*F21S 41/141* (2018.01)
(Continued)

(52) U.S. Cl.
CPC .......... *H01L 25/18* (2013.01); *H01L 23/5384* (2013.01); *H01L 24/08* (2013.01);
(Continued)

(58) Field of Classification Search
CPC . H01L 25/18; H01L 25/0753; H01L 23/5384; H01L 24/08; H01L 24/13;
(Continued)

(56) References Cited

U.S. PATENT DOCUMENTS

| 8,535,961 B1 * | 9/2013 | Kuo | H10H 20/8506 |
| | | | 257/E33.059 |
| 11,494,682 B2 * | 11/2022 | Elsherbini | H10N 60/805 |

(Continued)

FOREIGN PATENT DOCUMENTS

| CN | 116114062 | 5/2023 |
| EP | 3968373 | 3/2022 |

(Continued)

OTHER PUBLICATIONS

"Korean Application Serial No. 10-2023-7005357, Response filed Nov. 19, 2024 to Notice of Preliminary Rejection mailed Nov. 4, 2024", with English claims, 22 pages.
(Continued)

*Primary Examiner* — Mary Ellen Bowman
(74) *Attorney, Agent, or Firm* — Schwegman, Lundberg & Woessner, P.A.

(57) ABSTRACT

A packaging structure for a light emitter pixel array includes a plurality of pixels, with at least some pixels laterally separated from each other with a pixel light confinement structure. An inorganic substrate having a top redistribution layer is attached to the plurality of pixels and at least one through silicon via containing an electrical conductor is defined to pass through the inorganic substrate and support an electrical coupling with the top redistribution layer.

20 Claims, 7 Drawing Sheets

Related U.S. Application Data

(60) Provisional application No. 63/052,151, filed on Jul. 15, 2020.

(51) Int. Cl.

| | | |
|---|---|---|
| *F21S 41/20* | (2018.01) | |
| *G03B 15/05* | (2021.01) | |
| *H01L 23/00* | (2006.01) | |
| *H01L 23/538* | (2006.01) | |
| *H01L 25/075* | (2006.01) | |
| *H10H 20/825* | (2025.01) | |
| *H10H 20/851* | (2025.01) | |
| *H10H 20/855* | (2025.01) | |
| *H10H 20/857* | (2025.01) | |
| *H10H 29/14* | (2025.01) | |

(52) U.S. Cl.
CPC ............. *H01L 24/13* (2013.01); *H01L 24/16* (2013.01); *H01L 25/0753* (2013.01); *H10H 20/825* (2025.01); *H10H 20/8512* (2025.01); *H10H 20/855* (2025.01); *H10H 20/857* (2025.01); *H10H 29/142* (2025.01); *F21S 41/141* (2018.01); *F21S 41/285* (2018.01); *G03B 15/05* (2013.01); *G03B 2215/0567* (2013.01); *H01L 2224/08238* (2013.01); *H01L 2224/13082* (2013.01); *H01L 2224/13111* (2013.01); *H01L 2224/13139* (2013.01); *H01L 2224/13147* (2013.01); *H01L 2224/16225* (2013.01); *H01L 2924/014* (2013.01)

(58) Field of Classification Search
CPC .... H01L 24/16; H10H 29/142; H10H 20/855; H10H 20/825; H10H 20/857; H10H 20/8512

See application file for complete search history.

(56) References Cited

U.S. PATENT DOCUMENTS

| | | | |
|---|---|---|---|
| 2010/0117530 A1* | 5/2010 | Lin ................... | H10H 20/8515 313/512 |
| 2010/0258819 A1 | 10/2010 | Marfeld et al. | |
| 2015/0096798 A1 | 4/2015 | Uzoh | |
| 2017/0345802 A1* | 11/2017 | Sung ................. | H10H 20/8515 |
| 2017/0358562 A1 | 12/2017 | Banna et al. | |
| 2018/0187839 A1 | 7/2018 | Vampola | |
| 2018/0269191 A1 | 9/2018 | England et al. | |
| 2019/0074266 A1 | 3/2019 | Andrews | |
| 2019/0096864 A1 | 3/2019 | Huitema et al. | |
| 2019/0131267 A1 | 5/2019 | Wang et al. | |
| 2019/0195466 A1* | 6/2019 | Shimizu ............ | H10H 20/8514 |
| 2019/0206926 A1 | 7/2019 | Diana et al. | |
| 2020/0091215 A1* | 3/2020 | Jang ................... | H10F 39/811 |
| 2020/0212100 A1 | 7/2020 | Masui et al. | |
| 2023/0154911 A1 | 5/2023 | Hin et al. | |

FOREIGN PATENT DOCUMENTS

| | | |
|---|---|---|
| EP | 4182970 | 5/2023 |
| JP | 2008543016 | 11/2008 |
| JP | 5450680 | 3/2014 |
| JP | 2020085960 | 6/2020 |
| JP | 2023502868 | 1/2023 |
| KR | 101279225 | 6/2013 |
| KR | 20170135651 | 12/2017 |
| KR | 20230039705 | 3/2023 |
| WO | 2011108664 | 9/2011 |
| WO | 2018191551 | 10/2018 |
| WO | 2019126728 | 6/2019 |
| WO | 2019133628 | 7/2019 |
| WO | 2022016004 | 1/2022 |

OTHER PUBLICATIONS

"European Application Serial No. 21841329.2, Response filed Jan. 27, 2025 to Extended European Search Report mailed Jul. 10, 2024", 13 pages.
"Japanese Application Serial No. 2023-502868, Notification of Reasons for Refusal mailed Feb. 6, 2024", with English translation, 8 pages.
"International Application Serial No. PCT US2021 041867, International Search Report mailed Nov. 2, 2021", 4 pgs.
"International Application Serial No. PCT US2021 041867, Written Opinion mailed Nov. 2, 2021", 4 pgs.
"International Application Serial No. PCT US2021 041867, International Preliminary Report on Patentability mailed Jan. 26, 2023", 6 pgs.
"European Application Serial No. 20195344.5, Extended European Search Report mailed Feb. 12, 2021", 10 pgs.
"Japanese Application Serial No. 2023-502868, Response filed Apr. 17, 2024 to Notification of Reasons for Refusal mailed Feb. 6, 2024", with English claims, 13 pages.
"European Application Serial No. 21841329.2, Extended European Search Report mailed Jul. 10, 2024", 8 pgs.
"Japanese Application Serial No. 2023-502868, Notification of Reasons for Refusal mailed Aug. 6, 2024", with English translation, 6 pages.
"Korean Application Serial No. 10-2023-7005357, Notice of Preliminary Rejection mailed Nov. 4, 2024", with English translation, 20 pages.
"Korean Application Serial No. 1020237005357, Amendment Filed mailed Feb. 15, 2023", with English translation, 27 pages.
"Korean Application Serial No. 1020237005357, Final Office Action mailed May 14, 2025", w/ English translation, 7 pgs.

\* cited by examiner

LOW Z-HEIGHT LED ARRAY PACKAGE HAVING TSV SUPPORT STRUCTURE

CROSS REFERENCE TO RELATED APPLICATIONS

This application is a continuation of International Application No. PCT/US2021/041867 filed on Jul. 15, 2021, which claims priority to U.S. Patent Application 63/052,151 filed Jul. 15, 2020 and to European Patent Application 20195344.5 filed Sep. 9, 2020. All of the above applications are incorporated herein by reference in their entirety.

TECHNICAL FIELD

The present disclosure generally relates to manufacture of high density substrates for densely packed light emitting diodes or lasers. An electrical interconnect system including through silicon vias (TSV) and supporting address of LED pixel arrays is described.

BACKGROUND AND SUMMARY

Semiconductor light-emitting devices (LEDs) can be arranged or formed in densely packed groups or blocks. However, when a light-emitting device is small, or many light-emitting devices are grouped together, providing reliable interconnections is difficult, particularly if each light-emitting device must be separately addressable and also provide adequate heat removal.

One solution for mounting LEDs with large numbers of addressable pixels can require provision of small electrical traces, extensive fan-in or fan-out structures, or vias. This can be accomplished, for example, by mounting individual LEDs or LED modules on a solid ceramic, glass, or silicon substrate. Unfortunately, such mounting systems can require use of expensive materials, provision for numerous microvias, and complex processing equipment. Further, in many cases ceramic mounting systems are poorly coefficient of thermal expansion (CTE) matched to organic circuit board material, resulting in early failure of trace interconnects due to thermal expansion and contraction cycles that result in traces breaking at the boundary between ceramic and organic materials.

In accordance with embodiments of the invention, a packaging structure for a light emitter pixel array includes a plurality of pixels, with at least some pixels laterally separated from each other with a pixel light confinement structure. An inorganic substrate having a top redistribution layer is attached to the plurality of pixels and at least one through silicon via containing an electrical conductor is defined to pass through the inorganic substrate and support an electrical connection with the top redistribution layer, the top redistribution layer disposed between the at least one through silicon via and the plurality of pixels.

In some embodiments, a top redistribution layer is attached to each pixel using a copper post.

In some embodiments, the top redistribution layer is in direct contact with the copper post, and each pixel is in direct contact with solder material attaching it to the copper post.

In some embodiments, the inorganic substrate further includes a bottom redistribution layer directly contacting the least one through silicon via containing an electrical conductor. In some embodiments, the at least one through silicon via is between the top redistribution layer and the bottom redistribution layer while directly contacting the top redistribution layer.

In some embodiments, the light confinement structure further includes phosphor material at least partially surrounded by a reflective side coating.

In some embodiments, the light confinement structure further includes a diffusing layer aligned with phosphor material In some embodiments, total Z-height of the packaging structure is 300 microns or less.

In some embodiments, the plurality of pixels includes at least nine pixels.

In some embodiments, the plurality of pixels are formed from a segmented GaN layer.

In some embodiments, the plurality of pixels are formed from a segmented GaN layer with pixels separated by infilled trenches.

In some embodiments, a CMOS die is attached to the bottom redistribution layer of the inorganic substrate.

In some embodiments, an underfill is provided between a segmented GaN layer and the inorganic substrate.

In some embodiments, circuitry is formed on the inorganic substrate.

In some embodiments, at least one sensor is attached to the inorganic substrate.

In some embodiments, at least one sensor temperature sensor is attached to the inorganic substrate.

In some embodiments, adjacent pixels are separated by the pixel light confinement structure by less than 30 microns.

In some embodiments, the pixel light confinement structure is spaced apart from the top redistribution layer by silicone or epoxy.

In accordance with embodiments of the invention, an adaptive illumination system includes a plurality of pixels having adjacent pixels laterally separated from each other by a pixel light confinement structure, each of the pixels being independently controllable; an inorganic substrate having a top redistribution layer attached to the plurality of pixels; and at least one through silicon via containing an electrical conductor and defined to pass through the inorganic substrate to support an electrical coupling with the top redistribution layer, the top redistribution layer disposed between the at least one through silicon via and the plurality of pixels; a lens spaced apart from the plurality of pixels and arranged to direct light emitted by the plurality of pixels.

In accordance with embodiments of the invention, a mobile device includes: a camera; a flash illumination system including: a plurality of pixels having adjacent pixels laterally separated from each other by a pixel light confinement structure; an inorganic substrate having a top redistribution layer attached to the plurality of pixels; and at least one through silicon via containing an electrical conductor and defined to pass through the inorganic substrate to support an electrical coupling with the top redistribution layer, the top redistribution layer disposed between the at least one through silicon via and the plurality of pixels; a lens spaced apart from the plurality of pixels and arranged to direct light emitted by the plurality of pixels into a field of view of the camera.

BRIEF DESCRIPTION OF THE DRAWINGS

Non-limiting and non-exhaustive embodiments of the present disclosure are described with reference to the following figures, wherein like reference numerals refer to like parts throughout the various figures unless otherwise specified.

DETAILED DESCRIPTION

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention.

Figure 1:
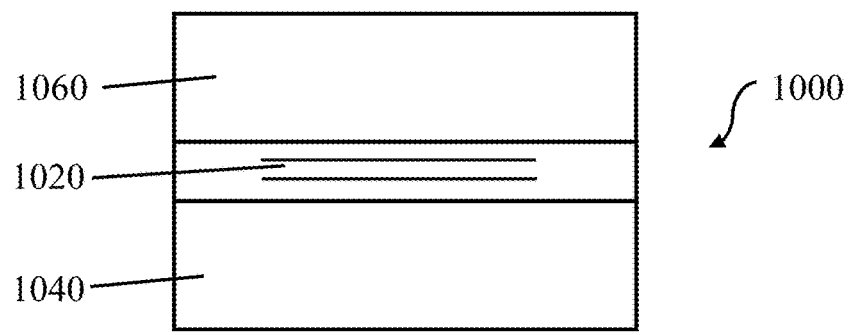
FIG. 1 shows a schematic cross-sectional view of an example pcLED.

FIG. 1 shows an example of an individual pcLED 1000 comprising a light emitting semiconductor diode (LED) structure 1020 disposed on a substrate 1040, and a phosphor layer 1060 disposed on the LED. Light emitting semiconductor diode structure 1020 typically comprises an active region disposed between n-type and p-type layers. Application of a suitable forward bias across the diode structure results in emission of light from the active region. The wavelength of the emitted light is determined by the composition and structure of the active region.

The LED may be, for example, a III-Nitride LED that emits ultraviolet, blue, green, or red light. LEDs formed from any other suitable material system and that emit any other suitable wavelength of light may also be used. Other suitable material systems may include, for example, III-Phosphide materials, III-Arsenide materials, and II-VI materials.

Any suitable phosphor materials may be used, depending on the desired optical output and color specifications from the pcLED.

Figure 2A:
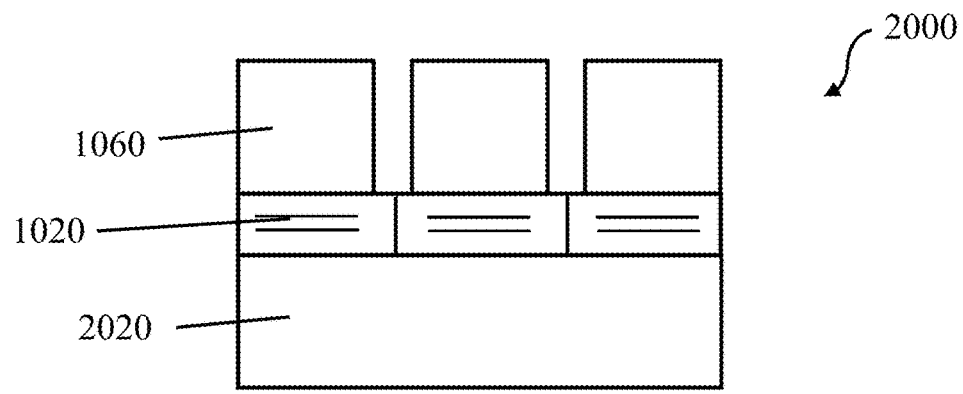
FIGS. 2A and 2B show, respectively, cross-sectional and top schematic views of an array of pcLEDs.
Figure 2B:
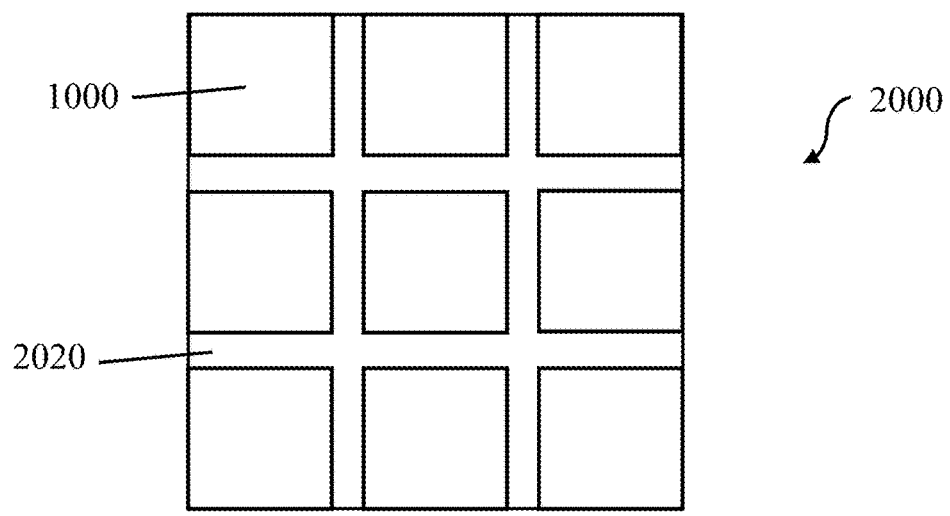

FIGS. 2A-2B show, respectively, cross-sectional and top views of an array 2000 of pcLEDs 1000 including phosphor pixels 1060 disposed on a substrate 2020. Such an array may include any suitable number of pcLEDs arranged in any suitable manner. In the illustrated example the array is depicted as formed monolithically on a shared substrate, but alternatively an array of pcLEDs may be formed from separate individual pcLEDs. Substrate 2020 may optionally comprise CMOS circuitry for driving the LED and may be formed from any suitable materials.

Although FIGS. 2A-2B, show a three-by-three array of nine pcLEDs, such arrays may include for example tens, hundreds, or thousands of LEDs. Individual LEDs (pixels) may have widths (e.g., side lengths) in the plane of the array, for example, less than or equal to 1 millimeter (mm), less than or equal to 500 microns, less than or equal to 100 microns, or less than or equal to 50 microns. LEDs in such an array may be spaced apart from each other by streets or lanes having a width in the plane of the array of, for example, hundreds of microns, less than or equal to 100 microns, less than or equal to 50 microns, less than or equal to 10 microns, or less than or equal to 5 microns. Although the illustrated examples show rectangular pixels arranged in a symmetric matrix, the pixels and the array may have any suitable shape or arrangement.

LEDs having dimensions in the plane of the array (e.g., side lengths) of less than or equal to about 50 microns are typically referred to as microLEDs, and an array of such microLEDs may be referred to as a microLED array.

An array of LEDs, or portions of such an array, may be formed as a segmented monolithic structure in which individual LED pixels are electrically isolated from each other by trenches and/or insulating material, but the electrically isolated segments remain physically connected to each other by portions of the semiconductor structure.

The individual LEDs in an LED array may be individually addressable, may be addressable as part of a group or subset of the pixels in the array, or may not be addressable. Thus, light emitting pixel arrays are useful for any application requiring or benefiting from fine-grained intensity, spatial, and temporal control of light distribution. These applications may include, but are not limited to, precise special patterning of emitted light from pixel blocks or individual pixels. Depending on the application, emitted light may be spectrally distinct, adaptive over time, and/or environmentally responsive. Such light emitting pixel arrays may provide pre-programmed light distribution in various intensity, spatial, or temporal patterns. The emitted light may be based at least in part on received sensor data and may be used for optical wireless communications. Associated electronics and optics may be distinct at a pixel, pixel block, or device level.

Figure 3A:
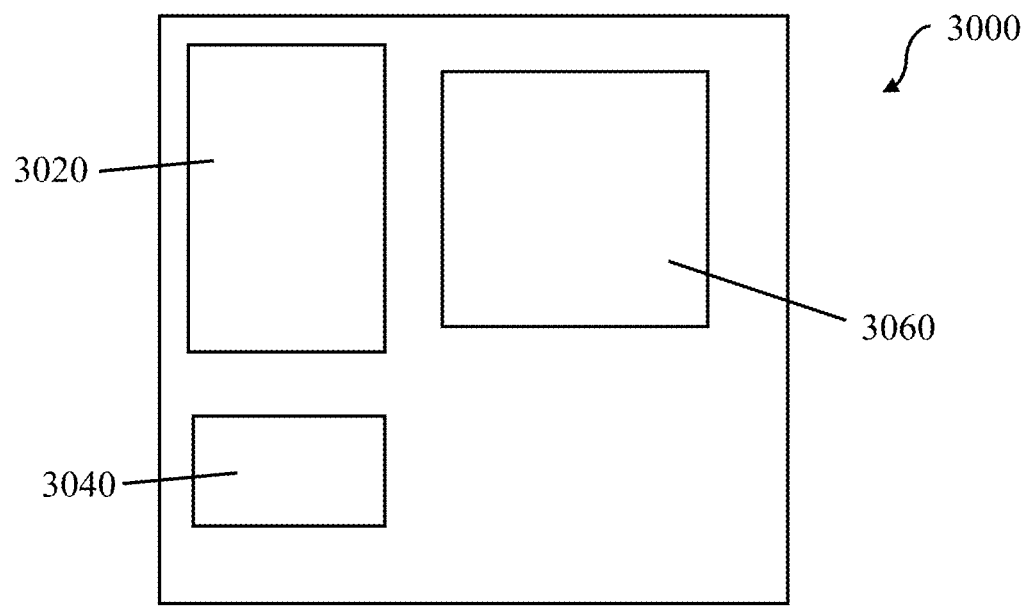
FIG. 3A shows a schematic top view of an electronics board on which an array of pcLEDs may be mounted, and FIG. 3B similarly shows an array of pcLEDs mounted on the electronic board of FIG. 3A.
Figure 3B:
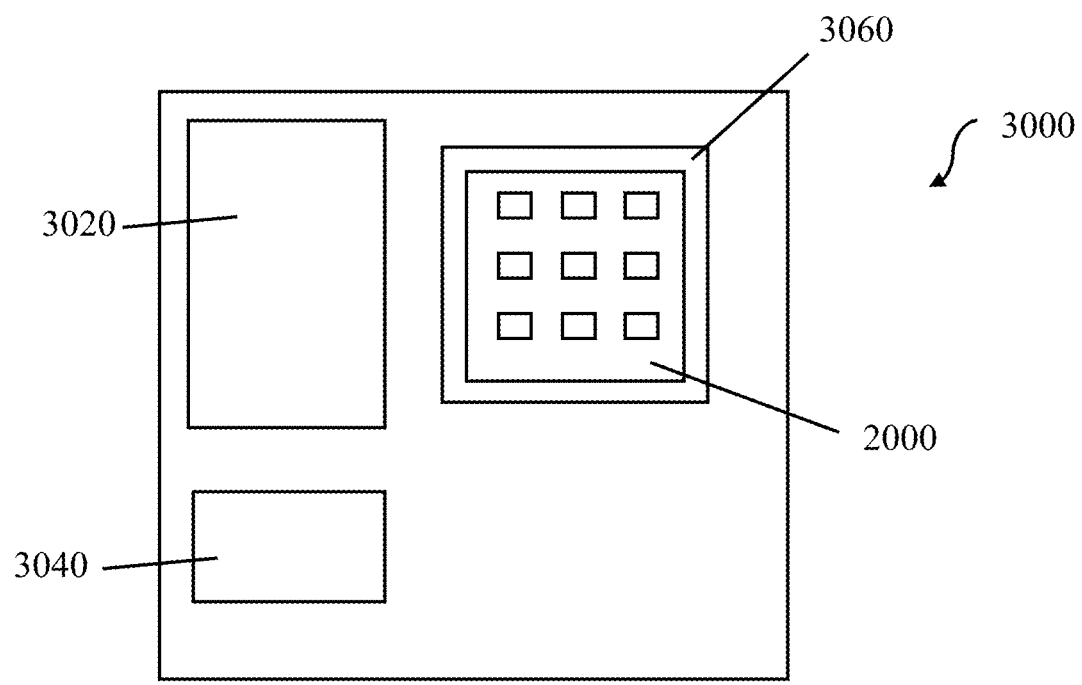

As shown in FIGS. 3A-3B, a pcLED array 2000 may be mounted on an electronics board 3000 comprising a power and control module 3020, a sensor module 3040, and an LED attach region 3060. Power and control module 3020 may receive power and control signals from external sources and signals from sensor module 3040, based on which power and control module 3020 controls operation of the LEDs. Sensor module 3040 may receive signals from any suitable sensors, for example from temperature or light sensors. Alternatively, pcLED array 2000 may be mounted on a separate board (not shown) from the power and control module and the sensor module.

Figure 4A:
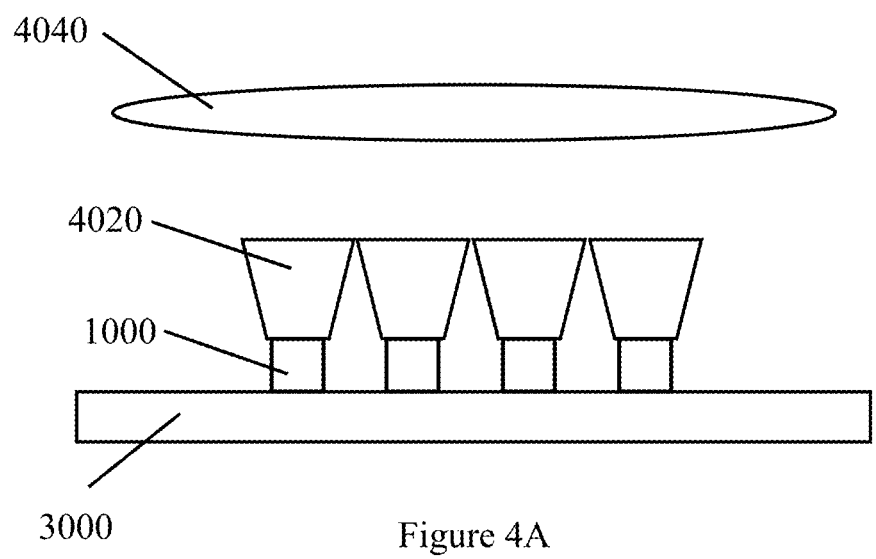
FIG. 4A shows a schematic cross-sectional view of an array of pcLEDs arranged with respect to waveguides and a projection lens.
Figure 4B:
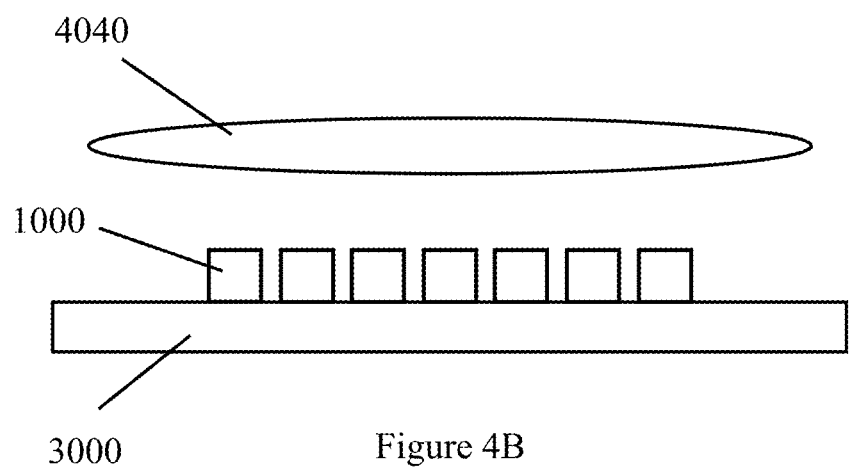
FIG. 4B shows an arrangement similar to that of FIG. 4A, without the waveguides.

Individual pcLEDs may optionally incorporate or be arranged in combination with a lens or other optical element located adjacent to or disposed on the phosphor layer. Such an optical element, not shown in the figures, may be referred to as a "primary optical element". In addition, as shown in FIGS. 4A-4B a pcLED array 2000 (for example, mounted on an electronics board 3000) may be arranged in combination with secondary optical elements such as waveguides, lenses, or both for use in an intended application. In FIG. 4A, light emitted by pcLEDs 1000 is collected by waveguides 4020 and directed to projection lens 4040. Projection lens 4040 may be a Fresnel lens, for example. This arrangement may be suitable for use, for example, in automobile headlights. In FIG. 4B, light emitted by pcLEDs 1000 is collected directly by projection lens 4040 without use of intervening waveguides. This arrangement may be particularly suitable when pcLEDs can be spaced sufficiently close to each other and may also be used in automobile headlights as well as in camera flash applications. A microLED display application may use similar optical arrangements to those depicted in FIGS. 4A-4B, for example. Generally, any suitable arrangement of optical elements may be used in combination with the LED arrays described herein, depending on the desired application.

An array of independently operable LEDs may be used in combination with a lens, lens system, or other optical system (e.g., as described above) to provide illumination that is adaptable for a particular purpose. For example, in operation such an adaptive lighting system may provide illumination that varies by color and/or intensity across an illuminated scene or object and/or is aimed in a desired direction. A controller can be configured to receive data indicating locations and color characteristics of objects or persons in a scene and based on that information control LEDs in an LED array to provide illumination adapted to the scene. Such data can be provided for example by an image sensor, or optical (e.g. laser scanning) or non-optical (e.g. millimeter radar) sensors. Such adaptive illumination is increasingly important for automotive, mobile device camera, VR, and AR applications.

Figure 5:
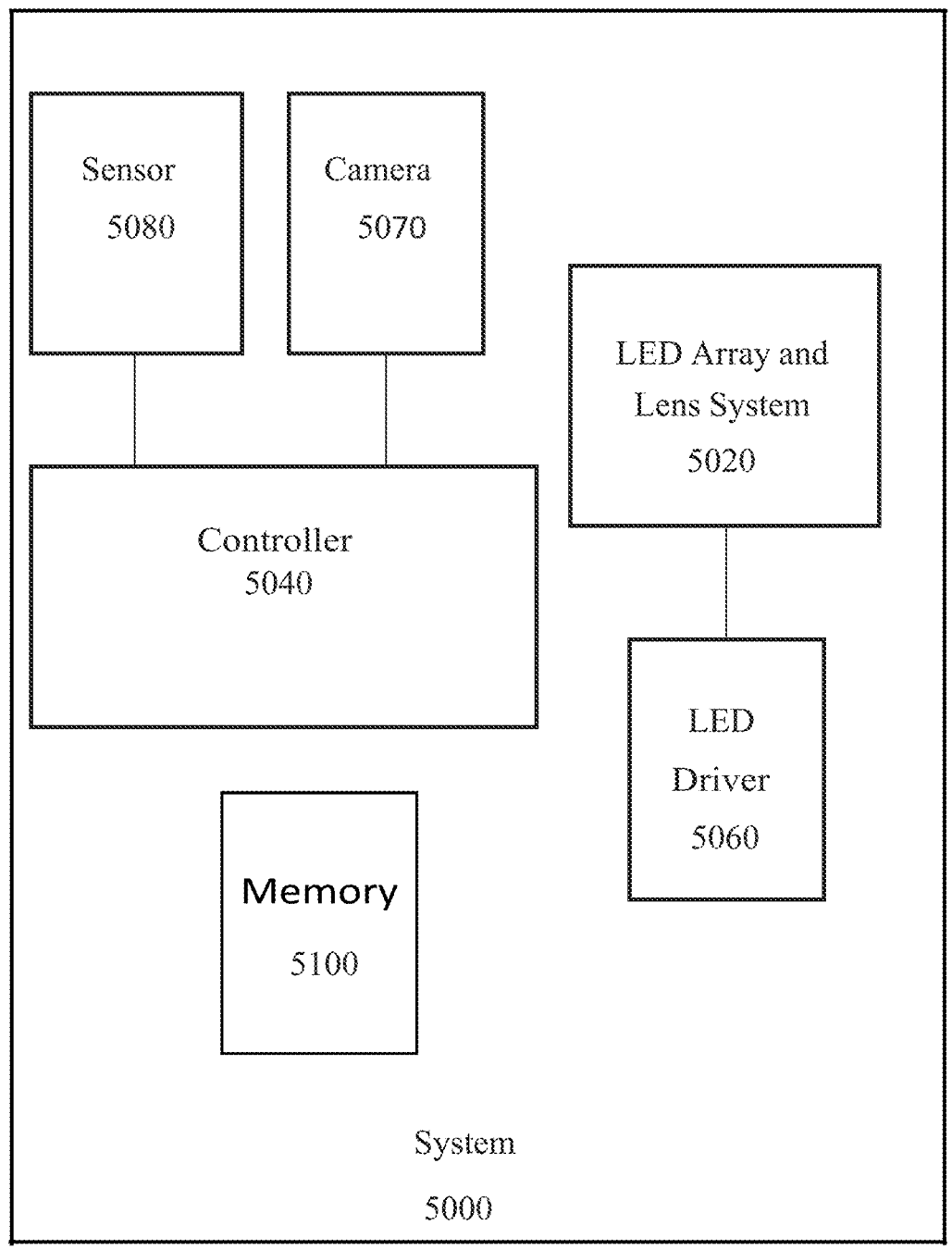
FIG. 5 schematically illustrates an example camera flash system comprising an adaptive illumination system.

FIG. 5 schematically illustrates an example camera flash system 5000 comprising an LED array and lens system 5020, which may be similar or identical to the systems described above. Flash system 5000 also comprises an LED driver 5060 that is controlled by a controller 5040, such as a microprocessor. Controller 5040 may also be coupled to a camera 5070 and to sensors 5080, and operate in accordance with instructions and profiles stored in memory 5100. Camera 5070 and adaptive illumination system 5020 may be controlled by controller 5040 to match their fields of view.

Sensors 5080 may include, for example, positional sensors (e.g., a gyroscope and/or accelerometer) and/or other sensors that may be used to determine the position, speed, and orientation of system 5000. The signals from the sensors 5080 may be supplied to the controller 5040 to be used to determine the appropriate course of action of the controller 5040 (e.g., which LEDs are currently illuminating a target and which LEDs will be illuminating the target a predetermined amount of time later).

In operation, illumination from some or all pixels of the LED array in 5020 may be adjusted—deactivated, operated at full intensity, or operated at an intermediate intensity. Beam focus or steering of light emitted by the LED array in 5020 can be performed electronically by activating one or more subsets of the pixels, to permit dynamic adjustment of the beam shape without moving optics or changing the focus of the lens in the lighting apparatus.

Figure 6:
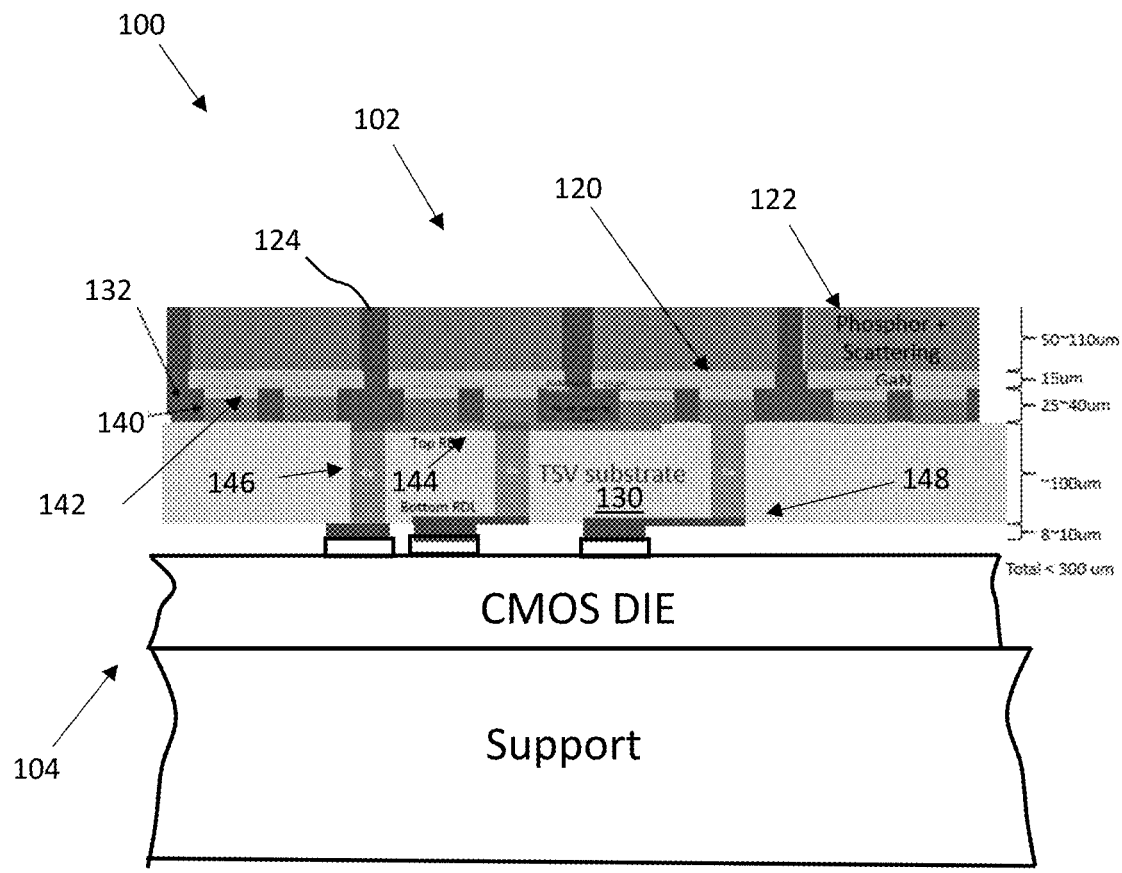
FIG. 6 illustrates one embodiment in cross section of a LED with a high-density substrate including through silicon vias.

As seen in FIG. 6, a packaging structure for a light emitter pixel array 100, shown in cross section, includes a multiple pixel assembly 102 that can be optionally mounted on a CMOS die and support 104. In one embodiment, the pixel assembly 102 includes GaN or other suitable active light emitter 120 topped with a phosphor and diffuser layer 122. Individual pixels are separated by a pixel light confinement structure 124. The active light emitter 120 and phosphor/diffuser 122 can be supported and electrically coupled—such as, e.g., directly electrically connected—using a silicon substrate 130 having through silicon vias (TSV) filled with electrically conductive material. In one embodiment, copper or other metallic posts 140 can be attached to the light emitter 120 with a solder material 142. The copper pillar 140 can be protected and the light emitter 120 attached to the silicon substrate 130 with the aid of an electrically non-conductive and adhesive underfill 132. The copper pillars 140 can be attached to an electrically conductive top redistribution layer 144 formed or applied to a top surface of the silicon substrate 130. The top redistribution layer 144 is electrically coupled (e.g., directly electrically connected) to electrically conductive material in through silicon vias (TSV) 146. The TSV 146 is in turn connected to an electrically conductive bottom redistribution layer 148 formed or applied to a bottom surface of the silicon substrate 130. Advantageously, this dense electrical connection scheme allows pixels or groups or pixels to be separately addressed and controlled for light intensity. In some embodiments, thickness (Z-height) of the multiple pixel assembly 102 is 500 microns or less. In some embodiments, thickness of the multiple pixel assembly 102 is 300 microns or less. In some embodiments, thickness is between 250 and 300 microns. In some embodiments, thickness of the multiple pixel assembly 102 is 250 microns or less. In some embodiments, thickness is between 100 and 300 microns.

There are various advantages to the described structure and system. Use of a silicon substrate for light emitting elements provides dense interconnect for adaptive lighting systems, while also providing good thermal transfer characteristics as compared to organic substrates. Also, low Z-height packaging is needed for thin, non-bulky lighting modules. In particular, having a height similar to simple LED flash lighting systems allows for easy redesign and replacement of conventional non-pixel camera flash with addressable adaptive flash.

The multiple pixel assembly 102 can include light emitting elements of various types, sizes, and layouts. In one embodiment, one or two dimensional matrix arrays of individually addressable light emitting diodes (LEDs) can be used. N×M arrays of individually addressable LEDs where N and M are respectively between one and two thousand can be used. N×M arrays of individually addressable LEDs where N and M are respectively between three and nine can be used, such as arrays of 3×3 or arrays of 7×7. Individual LED structures can have a square, rectangular, hexagonal, polygonal, circular, arcuate or other surface shape when viewing the plane of the light emission surface of the LED. Arrays of the LED assemblies or structures can be arranged in geometrically straight rows and columns, staggered rows or columns, curving lines, or semi-random or random layouts. LED assemblies can include multiple LEDs formed as individually addressable pixel arrays. In some embodiments, radial or other non-rectangular grid arrangements of conductive lines to the LED can be included. In some embodiments, curving, winding, serpentine, and/or other suitable non-linear arrangements of electrically conductive lines to the LEDs can be included.

To provide a range of colors, various phosphors and associated diffusers 122 can be used. Diffusers can include films, coatings, or dispersed titanium oxide in a polymeric binder or other suitable material. In addition to diffusers, LED structures can be overlain with wavelength converting materials such as molded or ceramic phosphor or other materials such as quantum dots or dyes. Multiple types and thicknesses of phosphors can be used. An LED combined with one or more wavelength converting materials may be used to create white light or monochromatic light of other colors. All or only a portion of the light emitted by the LED may be converted by the wavelength converting material. Unconverted light may be part of the final spectrum of light, though it need not be. Examples of common devices include a blue-emitting LED combined with a yellow-emitting phosphor, a blue-emitting LED combined with green- and red-emitting phosphors, a UV-emitting LED combined with blue- and yellow-emitting phosphors, and a UV-emitting LED combined with blue-, green-, and red-emitting phosphors. The phosphors can be electrophoretically deposited on an LED with application of a voltage. Varying applied voltage duration will correspondingly vary amount and thickness of deposited phosphors. Alternatively, the LED can be coated with the phosphor, using an organic binder to adhere the phosphor particles to the LED. Phosphors and/or diffuser material can be dispensed, screen printed, sprayed, molded, applied as films, or laminated. Alternatively, for certain applications, a phosphor contained in glass, or a pre-formed sintered ceramic phosphor can be attached to the LED. In some embodiments, thickness (Z-height) of phosphors and associated diffusers 122 is 200 microns or less. In some embodiments, thickness of phosphors and associated diffusers 122 is between 50 and 110 microns. The phosphor layer within the phosphors and associated diffusers 122 may have a thickness of 60 microns or less, and may be a segmented phosphor in silicone where each segments has a width matching the LED width. The diffuser element within the phosphor and associated diffusers 122 may have a thickness of 5 to 100 microns, such as 5 to 45 microns. The diffuser element may be titanium oxide or aluminum oxide dispersed inside a binder element with the titanium oxide. The titanium oxide or aluminum oxide dispersed inside the binder element may have a concentration from 0.01% to 3% by weight, such as 0.6%

The pixel light confinement structure 124 can be a light reflective or light absorptive sidewall coating. This can include or have additional light absorbers, reflectors (including stack of dielectric layers that form a distributed Bragg reflector for a sidewall), other optical coating, or electrically insulative material. Optically and electrically isolating dielectric material that can include one or more organic, inorganic, or organic/inorganic binders and filler materials can be used. For example, adhesives, epoxies, acrylate or nitrocellulose can be used in conjunction with ceramic or light absorptive or scattering particles. Another organic/inorganic binder, filler, or sidewall can be, for example, epoxy with embedded reflective titanium oxide or other reflective/scattering particles. The pixel light confinement structure 124 may be titanium oxide in silicone with the titanium oxide comprising 60% by weight. Inorganic binders can include sol-gel (e.g., a sol-gel of TEOS or MTMS) or liquid glass (e.g., sodium silicate or potassium silicate), also known as water glass. In some embodiments binders can include fillers that adjust physical properties. Fillers can include inorganic nanoparticles, silica, glass particles or fibers, or other materials able to improve optical or thermal performance. In some embodiments, pixel light confinement structure 124 is arranged to have a width of 30 microns or less, such as 20 microns or less. In some embodiments, distance between pixels is between 30 and 5 microns.

In some embodiments, the active light emitter 120 can be formed from semiconductor materials capable of forming high-brightness light emitting devices can include, but are not limited to, Group III-V semiconductors, particularly binary, ternary, and quaternary alloys of gallium, aluminum, indium, and nitrogen, also referred to as III-nitride materials. Such semiconductor materials can be grown to support both LED and laser systems as necessary. In some embodiments, a sapphire substrate that can be thinned or otherwise removed in whole or in part can be used. In some embodiments, the LED die can be further thinned. In some embodiment, GaN grown on a sapphire substrate removed by laser lift-off techniques is used. In some embodiments, GaN can be wholly or partially separated (e.g. partially cut through to define a trench) into pixels or groups of pixels. In some embodiments, thickness (Z-height) of the active light emitter 120 is 15 microns or less. In some embodiments, thickness of the active light emitter 120 is selected to be between 15 and 7 microns.

In some embodiments, copper or other metallic posts 140 can be attached to the light emitter 120 with a solder material 142. For example, the copper or other metallic posts 140 may comprise of a copper pillar consisting of copper with a solder cap of SnAg (tin silver) having a width of 40 microns or less and a pitch of 80 microns or less. In some embodiments, bump on trace, ACF, or Cu to Cu direct bonding can be used. In some embodiments, combined thickness (Z-height) of the metallic posts 140 and solder or other electrical connector is 60 microns or less. In some embodiments, combined thickness of the metallic posts 140 and solder or other electrical connector is between 10 and 60 microns.

The silicon substrate 130 may consist entirely of silicon. In some embodiments, the silicon substrate 130 can include other material in addition to silicon, which may be organic or inorganic substrate material. The silicon substrate may be an interposer for an attached CMOS die and the LEDs 120. Silicon substrates can be embedded or emplaced in surrounding inorganic or organic substrates, including but not limited to conventional printed circuit board substrates. In some embodiments, the silicon substrate can additionally include or be replaced completely with a glass, ceramic, or other inorganic material. In some embodiments, thickness (Z-height) of the substrate 130 is 100 microns or less. In some embodiments, thickness of the substrate 130 is between 40 and 100 microns. Accordingly, the TSV 146 through the substrate may have a thickness (Z-height) of 100 microns or less, such as between 40 and 100 microns. The TSV 146 may have an aspect ratio of 1:10, and a diameter between 5 to 10 microns. For example, if the TSV 146 has a diameter of 10 microns, it may have a thickness of 100 microns.

The substrate 130 can support various electrically conductive structures on a top, bottom, side, and/or interior of the substrate 130, including electrically conductive top redistribution layer 144 and bottom redistribution layer 148. Interior electrically conductive structures can be formed from electrically conductive vias defined in substrate 130. These conductive vias can be electrically connected (e.g., directly electrically connected) to top and bottom redistribution layers that horizontally extend electrical traces to connect to the conductive vias. In some embodiments, conductive vias can be microvias, wires, metal pillars, solder columns, or other suitable structures. As will be understood, various arrangements of electrical traces forming redistribution layers can be utilized, including fan-in, fan-out, linear, or curved horizontal layouts. Electrically conductive structures or traces can be formed from a variety of electrically conductive metals such as copper, silver, aluminum, gold, metal alloys or conductive polymeric compositions, graphene, or conductive ceramics. In some embodiments, use of underfill (e.g. silicone or epoxy) applied through coating, injection, molding, or other suitable application technique can reduce risk of unwanted electrical interconnect, while also providing at least some environmental protection.

Electrically conductive structures can be connected to suitable electric power and drive circuitry directly or through additional printed circuit board or other LED module systems. This power and drive circuitry can be provided by connection of the bottom redistribution layer 148 to the optional CMOS die and support 104. In some embodiments, thickness (Z-height) of the combined substrate 130 bottom redistribution layer 148 and contact pads on the CMOS and support 104 is 25 microns or less. In some embodiments, thickness of the combined substrate 130 bottom redistribution layer 148 and contact pads on the CMOS and support 104 is between 5 and 25 microns.

In some embodiments, a thermal conductor (e.g. a copper or other metal slug) can be attached to the bottom of the silicon substrate 130. In some embodiments, an optional printed circuit board with contact pads and electrical traces connecting to CMOS die or control circuitry placed beside or near the multiple pixel assembly 102 can be used.

In some embodiments, microlenses or other primary or secondary optical elements (including reflectors, scattering elements, or absorbers) may be attached or positioned with respect to each LED pixel and associated phosphor. In other embodiments, a primary optic can be positioned over the entire array of LED, and directly attached or mounted at a distance from the LED in suitable packaging. Protective layers, transparent layers, thermal layers, or other packaging structures can be used as needed for specific applications.

Figure 7:
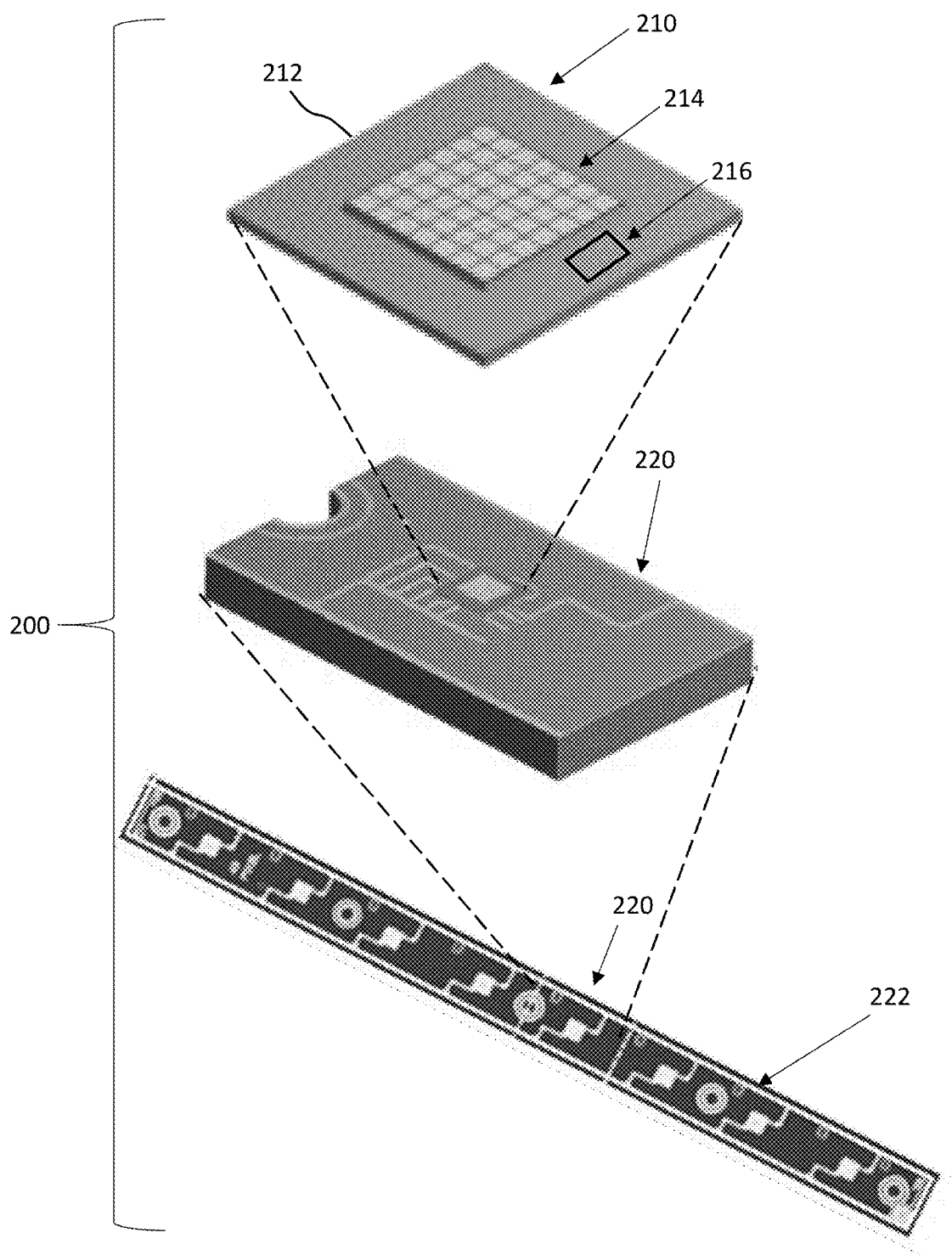
FIG. 7 illustrates multiple LEDs assembled on a strip.

FIG. 7 illustrates a system 200 including a multiple pixel assembly 210 assembled on a substrate 212, which can be inorganic or organic. Phosphors 214 are centered on the substrate 212, which includes a surrounding area capable of supporting CMOS die, control circuitry, or sensors 216. For example, in one embodiment sensors 216 can include one or more light, color, acceleration, or temperature sensors to actively monitor and control operation of the multiple pixel assembly 210. As illustrated, in one embodiment the multiple pixel assembly 210 can be mounted on a flexible printed circuit board 220. This printed circuit board 220 can further include multiple mounting positions 222 for addition pixel assemblies 210. The multiple pixel assembly 210 may correspond to the light emitter pixel array 100 described above, with the phosphors 214 corresponding to the phosphor and diffuser layer 122 and the substrate 212 including an element corresponding to the substrate 130, such that sensors 216 may be disposed on the substrate 130.

Figure 8A:
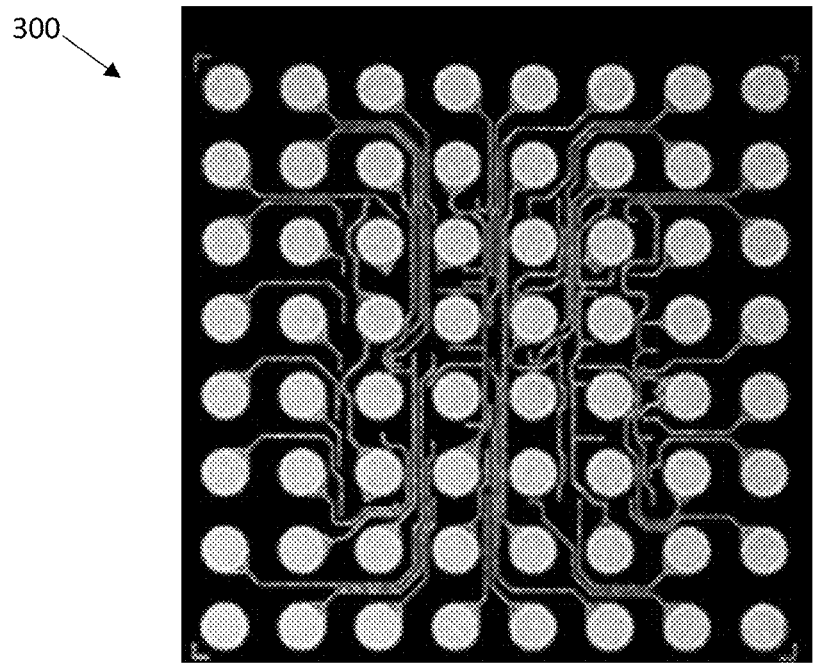
FIGS. 8A and 8B illustrate respectively back connections and internal connections for a through silicon via substrate.
Figure 8B:
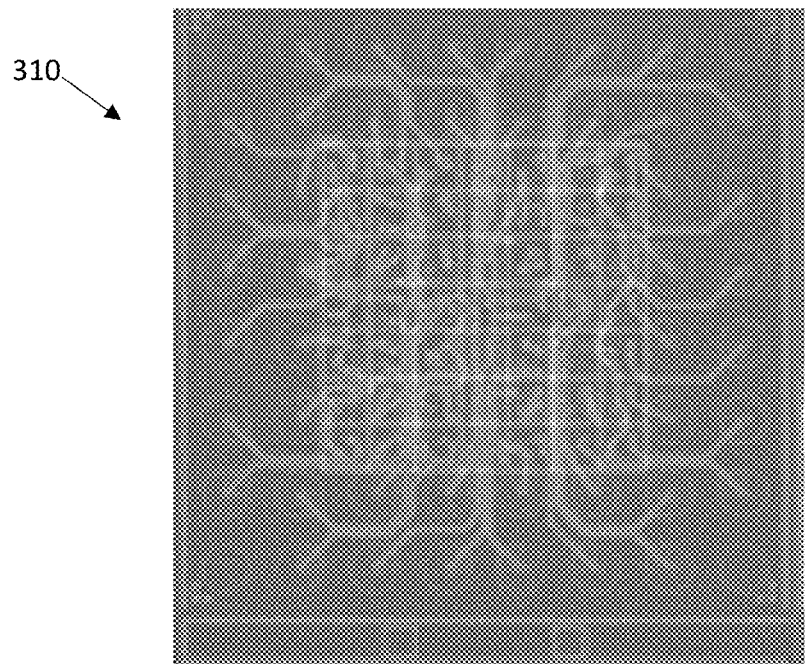

FIGS. 8A and 8B illustrate respectively bottom connections and internal connections for a through silicon via substrate. Using through silicon vias and internal redistribution layers, a complex connection scheme between the front and the back can be supported. Illustrated in FIG. 8A is a bottom redistribution layer 300 (corresponding to bottom redistribution layer 148 in FIG. 6) with traces connecting to copper emplaced in a through silicon vias. In some embodiments, the silicon vias (corresponding to TSV 146 in FIG. 1) are spaced equally from each other, e.g., along equidistant rows and columns in a grid. Spacing between silicon vias may be 50 microns or more, such as between 50 and 100 microns, between 50 and 80 microns, or between 50 and 60 microns. The traces connecting to the silicon vias are disposed with greater density towards a center of the grid and lesser density towards the outer parts of the grid. FIG. 8B illustrates connectivity 310 with a TSV substrate, e.g., traces in the top redistribution layer 310 (corresponding top redistribution layer 144 in FIG. 6). The traces may extend past the area including the pixels to connect to silicon vias outside the area including the pixels, i.e., some of the silicon vias and portions of some traces may not overlap with any of the pixels.

The various described embodiments supports light emitting pixel arrays (i.e. addressable LED assemblies) that may support applications that benefit from fine-grained intensity, spatial, and temporal control of light distribution. This may include, but is not limited to, precise spatial patterning of emitted light from pixel blocks or individual pixels. Depending on the application, emitted light may be spectrally distinct, adaptive over time, and/or environmentally responsive. The light emitting pixel arrays may provide pre-programmed light distribution in various intensity, spatial, or temporal patterns. The emitted light may be based at least in part on received sensor data and may be used for optical wireless communications. Associated optics may be distinct at a pixel, pixel block, or device level. An example light emitting pixel array may include a device having a commonly controlled central block of high intensity pixels with an associated common optic, whereas edge pixels may have individual optics. Common applications supported by light emitting pixel arrays include camera flashes, automotive headlights, architectural and area illumination, street lighting, and informational displays.

A light emitting pixel array may be well suited for camera flash applications for mobile devices. Typically, an intense brief flash of light from a high intensity LED is used to support image capture. Unfortunately, with conventional LED flashes, much of the light is wasted on illumination of areas that are already well lit or do not otherwise need to be illuminated. Use of a light emitting pixel array may provide controlled illumination of portions of a scene for a determined amount of time. This may allow the camera flash to, for example, illuminate only those areas imaged during rolling shutter capture, provide even lighting that minimizes signal to noise ratios across a captured image and minimizes shadows on or across a person or target subject, and/or provide high contrast lighting that accentuates shadows. If pixels of the light emitting pixel array are spectrally distinct, color temperature of the flash lighting may be dynamically adjusted to provide wanted color tones or warmth.

Automotive headlights that actively illuminate only selected sections of a roadway are also supported by light emitting pixel arrays. Using infrared cameras as sensors, light emitting pixel arrays activate only those pixels needed to illuminate the roadway while deactivating pixels that may dazzle pedestrians or drivers of oncoming vehicles. In addition, off-road pedestrians, animals, or signs may be selectively illuminated to improve driver environmental awareness. If pixels of the light emitting pixel array are spectrally distinct, the color temperature of the light may be adjusted according to respective daylight, twilight, or night conditions. Some pixels may be used for optical wireless vehicle to vehicle communication.

Architectural and area illumination may also benefit from light emitting pixel arrays. Light emitting pixel arrays may be used to selectively and adaptively illuminate buildings or areas for improved visual display or to reduce lighting costs. In addition, light emitting pixel arrays may be used to project media facades for decorative motion or video effects. In conjunction with tracking sensors and/or cameras, selective illumination of areas around pedestrians may be possible. Spectrally distinct pixels may be used to adjust the color temperature of lighting, as well as support wavelength specific horticultural illumination.

Street lighting is an important application that may greatly benefit from use of light emitting pixel arrays. A single type of light emitting array may be used to mimic various street light types, allowing, for example, switching between a Type I linear street light and a Type IV semicircular street light by appropriate activation or deactivation of selected pixels. In addition, street lighting costs may be lowered by adjusting light beam intensity or distribution according to environmental conditions or time of use. For example, light intensity and area of distribution may be reduced when pedestrians are not present. If pixels of the light emitting pixel array are spectrally distinct, the color temperature of the light may be adjusted according to respective daylight, twilight, or night conditions.

Light emitting arrays are also well suited for supporting applications requiring direct or projected displays. For example, warning, emergency, or informational signs may all be displayed or projected using light emitting arrays. This allows, for example, color changing or flashing exit signs to be projected. If a light emitting array is composed of a large number of pixels, textual or numerical information may be presented. Directional arrows or similar indicators may also be provided.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

The invention claimed is:

1. A packaging structure for a light emitter pixel array, comprising:
    a segmented monolithic structure comprising a plurality of pixels;
    an inorganic substrate having a top redistribution layer attached to the pixels; and
    at least one through via containing an electrical conductor and defined to pass through the inorganic substrate to support an electrical coupling with the top redistribution layer, the top redistribution layer disposed between the at least one through via and the pixels.

2. The packaging structure for the light emitter pixel array of claim 1, wherein the top redistribution layer is attached to each pixel using a copper post.

3. The packaging structure for the light emitter pixel array of claim 2, wherein the top redistribution layer is in direct contact with the copper post, and each pixel is in direct contact with solder material attaching the pixel to the copper post.

4. The packaging structure for the light emitter pixel array of claim 1, further comprising a pixel light confinement structure separating adjacent ones of the pixels from each other.

5. The packaging structure for the light emitter pixel array of claim 4, wherein the pixel light confinement structure is spaced apart from the top redistribution layer by silicone or epoxy.

6. The packaging structure for the light emitter pixel array of claim 4, wherein the pixel light confinement structure further comprises a diffusing layer aligned with phosphor material.

7. The packaging structure for the light emitter pixel array of claim 1, further comprising conductive lines electrically coupled to the pixels arranged in a non-rectangular arrangement.

8. The packaging structure for the light emitter pixel array of claim 1, wherein the segmented monolithic structure has infilled trenches laterally separating adjacent ones of the pixels from each other.

9. The packaging structure for the light emitter pixel array of claim 1, wherein the pixels are independently controllable.

10. The packaging structure for the light emitter pixel array of claim 1, further comprising underfill between the segmented monolithic structure and the inorganic substrate.

11. The packaging structure for the light emitter pixel array of claim 1, further comprising circuitry formed on the inorganic substrate.

12. The packaging structure for the light emitter pixel array of claim 1, further comprising a support upon which the inorganic substrate is disposed, and a CMOS die on the support.

13. The packaging structure for the light emitter pixel array of claim 1, further comprising an optical element disposed over at least some of the pixels.

14. The packaging structure for the light emitter pixel array of claim 1, wherein the pixels have a hexagonal or arcuate shape.

15. The packaging structure for the light emitter pixel array of claim 1, further comprising traces connected to the at least one through via, the traces having a greater density toward a center of the pixel array compared to an outer edge of the pixel array.

16. A packaging structure for a light emitter array, comprising:
    a segmented monolithic structure comprising a plurality of light emitting elements; and
    a substrate attached to the segmented monolithic structure, the substrate having a top redistribution layer, a bottom redistribution layer, and a plurality of through vias extending through the substrate to provide electrical coupling between the top redistribution layer and the bottom redistribution layer.

17. The packaging structure for the light emitter array of claim 16, wherein the light emitting elements are arrayed in curving lines, and/or staggered rows or columns.

18. The packaging structure for the light emitter pixel array of claim 16, wherein a total Z-height of the packaging structure is less than 300 microns.

19. A packaging structure for a light emitter pixel array, comprising:
    a segmented monolithic structure comprising a plurality of pixels arranged in a 7×7 matrix; and
    a silicon substrate attached to the segmented monolithic structure and having a total Z-height of 100 microns or less, the silicon substrate having a top redistribution layer, a bottom redistribution layer, and a plurality of through silicon vias (TSVs) extending through the silicon substrate to provide electrical coupling between the top redistribution layer and the bottom redistribution layer.

20. The packaging structure for the light emitter pixel array of claim 19, wherein the segmented monolithic structure is a segmented GaN layer.

* * * * *